United States Patent [19]
Yamamoto et al.

[11] 3,981,074
[45] Sept. 21, 1976

[54] METHOD FOR PRODUCING PLASTIC BASE CAPS FOR SPLIT CAVITY TYPE PACKAGE SEMI-CONDUCTOR UNITS

[75] Inventors: Katsumi Yamamoto; Masahiro Fujimori; Masahiro Fujinawa; Sanenobu Sonoda, all of Ibaragi, Japan

[73] Assignee: Nitto Electric Industrial Co., Ltd., Ibaragi, Japan

[22] Filed: Aug. 23, 1974

[21] Appl. No.: 499,951

[52] U.S. Cl. .................................. 29/588; 29/590; 29/591; 29/627; 264/265; 264/272
[51] Int. Cl.² ............................................. B01J 17/00
[58] Field of Search ................. 29/588, 576 S, 627, 29/590; 264/265, 272; 156/153

[56] References Cited
UNITED STATES PATENTS

| | | | |
|---|---|---|---|
| 3,482,419 | 12/1969 | Rogers | 29/576 S |
| 3,622,419 | 11/1971 | London | 29/588 |
| 3,627,901 | 12/1971 | Happ | 29/588 |

Primary Examiner—W. Tupman
Attorney, Agent, or Firm—Sughrue, Rothwell, Mion, Zinn & Macpeak

[57] ABSTRACT

A method for producing a completed base cap for a plastic package sealing a semi-conductor therein includes the steps of forming the initial body of a plastic base cap including a centrally located hollow recess on one side thereof, placing lead frames on said base cap body in such a manner that the terminal end portions of said individual leads rest on the peripheral land of said base cap body surrounding said central recess, and forming outer side sections to the base cap including a step shoulder on the top side thereof by molding the same integrally with said lead frame and said initial body such that an intermediate portion of each of said leads adjacent their inner terminal end portions is embedded within said outer side sections of the base cap. A liquid honing step is provided on the base cap shoulder after the formation thereof, and to the inner terminal end portions of the leads.

6 Claims, 8 Drawing Figures

METHOD FOR PRODUCING PLASTIC BASE CAPS FOR SPLIT CAVITY TYPE PACKAGE SEMI-CONDUCTOR UNITS

BACKGROUND OF THE INVENTION

1. Field of the Invention

This invention relates to a method for producing plastic package base caps for sealing semi-conductor elements or semi-conductor integrated circuit units therein with respect to an overlying top cap.

2. Description of the Prior Art

One prior art method of sealing semi-conductor elements from the surrounding atmosphere is to place the semi-conductor element in a plastic material and by molding the plastic about the semi-conductor element, producing a directly embedded semi-conductor arrangement. In such system, however, the semi-conductor element is subjected to substantial stresses and strains due to temperature variations during the molding process or during use of the semi-conductor circuit.

This problem arises by reason of different coefficients of thermal expansion of the plastic material comprising the package and the semi-conductor element and will often lead to a break in the lead wires or complete destruction of the semi-conductor unit.

Recently, a cavity mold package arrangement has been developed wherein the semi-conductor element is not in direct contact with the plastic material of the package.

FIG. 1 illustrates a typical example of the semi-conductor unit of the cavity mold package arrangement. In this arrangement, a lead frame includes leads 1, 1' which extend through and are integrated with a plastic package 2 formed from a molded powdered epoxide polymer. A semi-conductor element 3 is mounted in the package 2 and is electrically connected to the lead frame by a conventional wire bonding technique. A top cap 5 is sealably secured to the package by using heat and pressure responsive adhesive, preferably epoxide resin adhesive 6.

With such system, however, it is difficult to place the lead frame in the powder plastic material during the molding of the package 2 in such a manner that the inner terminal ends of the leads 7 extending into the package cavity C are consistently coplanar with one another in the molded package.

When the inner terminal ends of the leads are not consistently flush, the bonding of the lead frame terminals to the fine internal lead wires used for connecting the lead frames to the semi-conductor element can not readily be carried out by using a wire bonder and this leads to the formation of bonds having poor bonding strength between the lead frame and the internal lead wires.

Under certain circumstances, the bonding operation itself becomes impossible.

Also, during the production of the packages of this type, it is necessary to provide a liquid honing step for removing the cured plastic material on the portions 7 of the lead frame which are disposed and uncovered within the hollow cavity after completion of the molding. The amount of cured plastic material built-up on the leads 7 is substantially large and the honing step consumes much time.

Further, because of contact of one side 8 of the lead frame terminal portions 7 located within the package cavity with the plastic material (bonded thereto during the molding operation), the gas-tight seal can easily be impaired or lost when the package is placed in an atmosphere with substantial temperature variations, due to the differential between the coefficients of thermal expansion of the cured plastic material and the lead frame.

SUMMARY OF THE INVENTION

The present invention is directed toward the objective of overcoming the above problems and providing an improved method for producing plastic packages for sealing semi-conductors which comprises the steps of forming the body of a plastic base cap including a centrally located hollow recess on one side thereof, placing a lead frame on the base cap body in such a manner that the internal terminal end portions of the individual leads rest on the peripheral land of the base cap body surrounding the central recess, and forming outer side sections of the base cap each including a step shoulder on the top side thereof by molding the same integrally with the lead frame such that a portion of each of the leads adjacent the terminal end thereof protrudes inwardly from the outer section of the base cap.

A preferred embodiment of the invention will now be described in reference to the drawings.

DESCRIPTION OF THE PREFERRED EMBODIMENT

Figure 1:
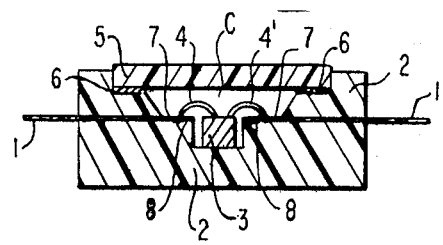
FIG. 1 is a cross sectional view in elevation showing a conventional semi-conductor unit.

Referring to FIGS. 2, 3, 6 and 7, a preformed initial plastic base cap body 12 includes a centrally located hollow recess 11 on one side thereof and a peripheral land 13 surrounding the recess 11. A plurality of leads 14 of a lead frame have their inner terminal ends resting on the peripheral land 13. The dotted section 18 in FIG. 3 designates an upper hollow space of the base cap to be formed later.

Figure 4:
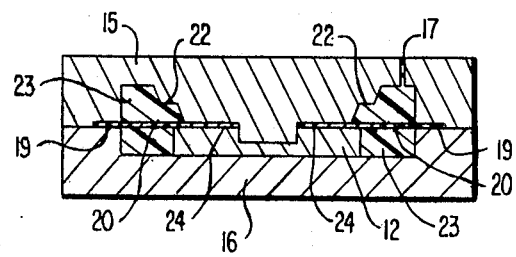
FIG. 4 is a cross sectional view showing the assembly of the base cap body and the lead frame placed within a mold assembly.

The assembly comprising the plastic base cap and the lead frame is placed within a mold assembly, FIG. 4, comprising a pair of upper and lower mold sections 15 and 14 constructed such that the plastic material introduced to the mold cavity will not fill the upper hollow space 18 described as in the manner shown in FIG. 4.

The plastic material is introduced through an inlet port 17 formed through the upper mold section and heated and cured in the mold cavity to form a pair of outer plastic base side sections 23, 23' each including a shoulder step 22 on the top side thereof and being integrally bonded to the base cap body 12 in such a manner that a portion 20 of each of the leads intermediate outer leads portion 19 and internal leads portion 24 is embedded in the molded wall of the base cap.

In FIG. 4, the areas indicated have been filled with the cured plastic material during the molding process.

Figure 5:
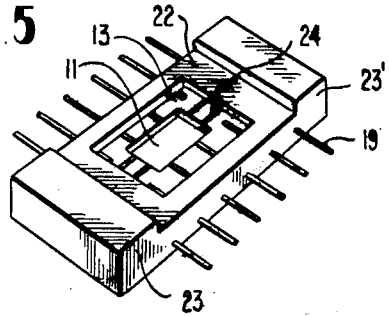
FIG. 5 is a perspective view showing a preferred example of the semi-conductor sealing plastic package base cap produced by the method of the invention prior to sealing a top cap thereto.

The resulting plastic package base cap for hermetic sealing of the semi-conductor element by way of an interfitting top cap is illustrated in FIG. 5. In the plastic package base cap of FIG. 5, a portion of each of the leads 24 is uncovered and protrudes into the base cap cavity from the outer sections 23, 23'.

It should be noted that the peripheral band or frame (indicated at 25 in FIG. 2) connecting the individual leads together at their outer ends has been removed from the semi-conductor sealing plastic package after molding of outer sections 23, 23', as shown in FIG. 5.

The base cap used in the present invention may be formed of any desired plastic material, such as epoxide resin polymer, and the lead frame can be constructed of copper, cobalt, phosphobronze and the like.

The side sections of the base cap may be formed from a powder plastic or liquid plastic polymer, preferably a powdered epoxide resin polymer, and may be molded integrally with the base cap and the lead frames through a transfer molding process.

During the succeeding steps in the manufacture of the semi-conductor sealing plastic package using the base cap constructed in the manner described, the terminating ends of the leads uncovered in the package cavity remain coplanar or consistently flush with one another which enables the subsequent bonding of the lead frames to the semi-conductor element placed within the hollow recess of the base cap to be carried out reliably without encountering any difficulty.

This can lead to substantially improved quality bond and also prevent build-up of cured plastic material on the uncovered portions of the leads in the package cavity. Even if a small amount of cured plastic material has stuck on the leads, it can be removed within a short time by liquid honing.

Since the portions of the leads lying on the peripheral land 13 of the base cap 12 surrounding the central recess 11 are not adhesively secured to the surface of the peripheral land, the sealing arrangement cannot be easily impaired when the plastic package containing the sealed semi-conductor is placed in an atmosphere providing substantial temperature variations.

It has also been found that a liquid honing operation can be carried out on the base cap constructed in accordance with the invention prior to the assembly of the complete semi-conductor sealing plastic package, and this will result in a further improved seal of the finished plastic package.

The liquid honing step may be provided with respect to the entire outer surface of the base cap or limited to the section of the base cap to be placed in contact with the plastic material supplied in the secondary integral molding process.

It is considered that the liquid honing step causes the surface of the base cap to become roughened to such an extent as to provide and retain an improved sealing arrangement of the semi-conductor sealing plastic package relative to the top cap applied thereto.

A typical example of roughened surface particularly suited for improving the seal of the semi-conductor sealing plastic package is that which exhibits surface roughness providing 1 to $20\mu$ $R_z$ defined by JISB0601, and this can be produced through a liquid honing process by using a specific liquid honing medium comprising a mixture containing water and synthetic emery abrasives in the particle size range 5 to $80\mu$ (defined by JISR 6111) in a volume ratio ranging 4:1 to 2.

Preferred examples of the present invention will be described below.

EXAMPLE 1

Figure 7:
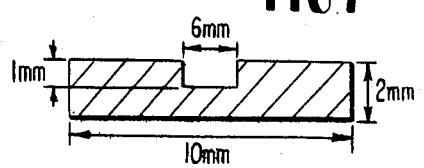
FIG. 7 is a cross sectional view of the initial base cap taken along line VII — VII of FIG. 6, and looking in the direction of the arrows.
Figure 6:
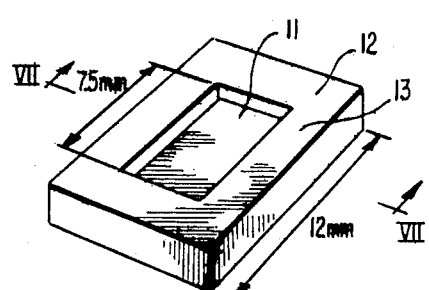
FIG. 6 is a perspective view showing a base cap used in the practice of the method of the invention prior to adding side sections thereto.

A 24 lead, lead frame constructed of phosphobronze ($250\mu$ thick, 500[ wide, the third class ½ H defined by JISH 3731), has the internal leads resting on the peripheral land of a base cap body as illustrated in FIGS. 6 and 7. The resulting assembly of the lead frame and the base cap body was installed in a mold assembly as shown in FIG. 4.

An epoxide resin powder produced by Nitto Electrical Industrial Co., Ltd., known as MP-2733, improved and tabletized at room temperature, was preheated at 80° C by high frequency heating and then introduced to and molded in the mold assembly of FIG. 4 at a temperature of 150° C, pressure of 170 kg/cm² and at a plunger injection rate of 10 mm/sec using a transfer molding machine.

After molding, a liquid honing operation was provided to remove the cured plastic surmounting the portions of the lead frame extending into the package cavity and also provide an improved surface characteristic so as to allow a top cap to be adhesively bonded easily and firmly to the step shoulder of the base cap when it is assembled thereon. The liquid honing consumed 5 sec. and the treatment was carried out using a liquid honing machine produced by Fuji Seiki Seizosho K. K., and by spraying an abrasive liquid containing water and powder of aluminum oxide (20 to $30\mu$) in the volume ratio 2:1, at a spraying pressure of 3 kg/cm².

Figure 2:
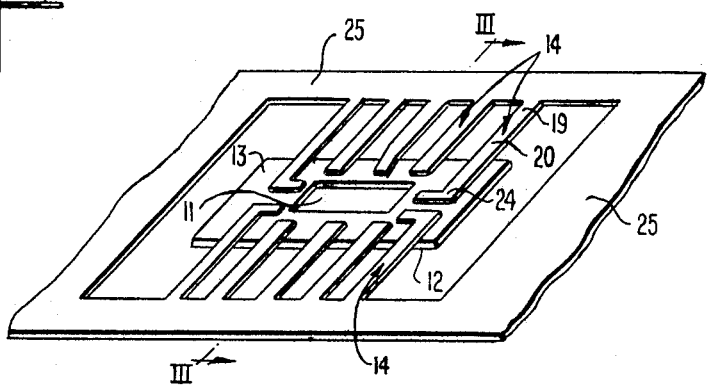
FIG. 2 is a perspective view showing the initial stage of the method of the invention.
Figure 3:
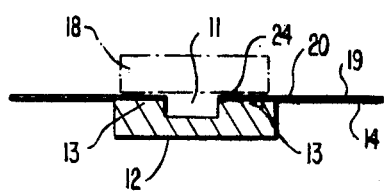
FIG. 3 is a cross sectional view taken along line III — III of FIG. 2 and looking in the direction of the arrows.
Figure 8:
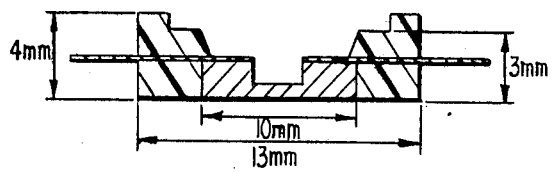
FIG. 8 is a cross sectional view showing the semi-conductor sealing plastic package base cap produced by the method of the invention using the preformed base cap illustrated in FIGS. 6 and 7.

The finished plastic package base cap for sealing a semi-conductor was that illustrated in FIG. 8 with the peripheral band or frame 25, FIG. 2, connecting the leads together.

The top cap to be mounted on the step shoulder of the base cap is 15 mm in length, 13 mm in lateral width and 1 mm thick. After the adhesive bonding of the top cap to the base cap in the manner described, a semi-conductor unit containing the semi-conductor element sealed within the package was obtained.

EXAMPLE 2

A base cap was produced in the same manner and with the same dimensions as Example 1 and a liquid honing treatment was provided with respect to the entire surface of the base cap. The resulting base cap was assembled in the manner described in Example 1 to form a complete plastic package containing a sealed semi-conductor.

The liquid honing treatment employed a liquid honing machine produced by Fuji Seiki Seizosho K. K., and was carried out be spraying an abrasive liquid containing water and powder of aluminum oxide (50 to $60\mu$) in the volume ratio 2:1 under a spraying pressure of 3 kg/cm² at 1 sec/cm².

COMPARATIVE EXAMPLE

A lead frame assembly identical to that used in Example 1 was integrally embedded in a plastic package having the same dimensions as the plastic package previously described in conjunction with FIG. 8, by molding the plastic package in a mold with the lead frames mounted therein. The plastic package was formed from an epoxide resin powder produced by Nitto Electric Industrial Co., Ltd., known as MP-2733 improved, and tabletized at room temperature.

The molding operation was carried out by preheating the plastic material at 80° C by high frequency heating and then injecting the preheated polymer into the mold at 150° C, 70 kg/cm² and at a plunger injection rate of 10 m/sec.

A liquid honing operation similar to Example 1 was provided to remove the cured plastic covering the portions of the lead frames protruding into the package cavity. The liquid honing treatment consumed 1 sec.

Leak tests were conducted on the samples of semi-conductor sealing plastic package produced in the above three examples in the manner defined by MIL STD 883 Method 1014 to examine the sealing arrangement between the plastic package and the lead frame and the test results are shown in Table 1.

Table 1

|  | Example 1 | Example 2 | Comparative Example |
| --- | --- | --- | --- |
| Initial | 0/100 | 0/100 | 0/100 |
| After cooling and heating test for 5 cycles | 0/100 | 0/100 | 1/100 |
| After P.C.C.T. |  |  |  |
| (a) for 5 cycles | 1/100 | 0/100 | 5/100 |
| (b) for 10 cycles | 3/100 | 0/100 | 6/100 |
| (c) for 20 cycles | 7/100 | 0/100 | 12/100 |

In Table 1, the initial values are the results of helium leak tests conducted on the samples of semi-conductor sealing plastic packages as they are produced in the respective examples. The values after cooling the heating test for 5 cycles are the results of the helium leak tests conducted on the samples after they were alternately subjected to a cold atmosphere at −60° C for 20 min. and a hot atmosphere at 150° C for 20 min. and this procedure is repeated five times.

P. C. C. T. are the initials of a pressure cooker cycle test wherein each cycle comprises the steps of maintaining the samples in a pressurized saturated water vapor at 125° C for 30 min. and then dipping the samples in water at room temperature for 30 min.

The results of helium leak tests conducted after 5, 10 and 20 cycles of the pressure cooker cycle test are shown in Table 1. It should be noted that the pressure cooker cycle tests are conducted on the samples which have been subjected to the 5 cycles of cooling and heating test described previously.

The values of Table 1 show the percentages of unacceptable seals found in the leak tests. More specifically, the denominator in each value represents the sum of the samples of semi-conductor sealing plastic packages used in each of the helium leak tests and the numerator represents the number of unacceptable packages resulting from the leak tests.

The unacceptable seals are those which exhibited leaks more than $10^{-7}$ Torr/sec. in each leak test.

It is known in the art that semi-conductor sealing packages having leaks in excess of $10^{-7}$ Torr/sec cannot actually be used for the purpose intended.

From the foregoing, it will readily be understood that the semi-conductor sealing plastic package constructed in accordance with the invention provides improved quality sealing for protecting the semi-conductor element contained in the package from deleterious effects of the ambient atmosphere.

Table 2 shows the results of tests conducted to examine variations in the vertical position of the terminal ends of the lead frames installed in the samples of semi-conductor sealing plastic packages produced in accordance with the above mentioned examples.

Table 2

|  | Example 1 | Example 2 | Comparative Example |
| --- | --- | --- | --- |
| Acceptable wire bond percentage | 140/140 | 140/140 | 82/140 |

The acceptable wire bond percentages in Table 2 were obtained by using a supersonic bonding machine produced by Lindbergh Co., U. S. A., and known as an Ultrasonic Stitch Bonder, and by bonding with fine aluminum wires 25 $\mu$ in diameter. The bonder was set at a spaced distance 50 to 80 $\mu$ from the semi-conductor element mounted in the base cap and from a randomly selected one of the lead frame terminals with a primary bonder on the terminal and a secondary bonder on the semi-conductor.

The denominator in each value represents the sum of the samples of semi-conductor sealing plastic package and the numerator represents the number of samples which have been found to have all the fine aluminum wires connected between the terminals and the semi-conductor element by the bonding operation with tensile strength above 1g.

It will readily be understood that the semi-conductor sealing plastic packages constructed in accordance with the present invention are completely free of variations in the level of the leads which enables the bonding operation to be carried out in an easy and efficient manner.

While the invention has been particularly shown and described with reference to a preferred embodiment thereof, it will be understood by those skilled in the art that various changes in form and details may be made therein without departing from the spirit and scope of the invention.

What is claimed is:

1. A method of producing a completed lead frame embedded plastic base cap for a sealed plastic split package semi-conductor unit wherein said unit comprises:

split base cap and top cap sections with at least said base cap being provided with an electronic element receiving cavity facing said top cap, an electronic element carried within said cavity, external leads extending through the sidewalls of the base cap with their inner ends terminating within said cavity, internal leads bonded to said element and to the ends of said external leads within said cavity, said top cap overlying said cavity and being peripherally sealed to said base cap, said method comprising the steps of:

providing a lower mold section with its upper face including a rectangular recess, placing an initial rectangular base cap body whose length and width are less than that of said lower mold section recess and whose height is generally equal thereto within said recess and spaced from the sides thereof to form a lower mold section rectangular mold cavity surrounding said initial base cap body, said initial base cap being formed with a centrally located, hollow cavity on one side thereof and a peripheral land defining said cavity, placing a lead frame on the initial base cap body in such a manner that the inner, terminal end portions of the individual leads rest on the peripheral land of said initial base cap body surrounding said central cavity of said initial base cap body, said lead frame extending at least over a portion of the upper face of said lower mold section placing an upper mold section overlying said lower mold section, said upper mold section including a rectangular mold cavity within the lower face thereof corresponding to the rectangular mold cavity of said lower mold section, said upper mold section including a central portion sealingly engaging said initial base cap body and further including an outer portion surrounding said upper mold section rectangular mold cavity sealingly engaging said lower mold section, and injecting molten material within said superposed molded cavity to integrally mold outer side sections to said initial base cap such that a portion of each of the external leads intermediate of the inner and outer terminal ends is embedded within said outer side sections of said base cap.

2. The method for producing a plastic base cap as claimed in claim 1, further comprising the step of molding a step shoulder on the upper face of each outer side section dimensioned to closely receive said top cap section such that by sealably fixing the periphery of the top cap section to said step shoulders, the electronic element and the internal leads are sealed from ambient.

3. The method for producing a plastic base cap as claimed in claim 1, further including the step of liquid honing the portions of the leads disposed within the hollow cavity after molding of the outer side sections to remove cured plastic material deposited thereon.

4. The method for producing a plastic base cap as claimed in claim 2, further comprising the step of liquid honing the uncovered portions of the leads within the package cavity to remove build up of cured plastic material thereon after molding of the outer side sections of the base cap and liquid honing of the outer side sections step shoulders to facilitate the sealing of the top cap periphery to the base cap step shoulders.

5. The method of producing a plastic base cap as claimed in claim 1, wherein said plastic base cap body is formed of expoxide resin and said outer side sections are molded thereto with the lead frames mounted therein by preheating epoxide resin powder after stabilizing at room temperature, and injecting the preheated plastic material into a mold supporting the lead frames with the individual leads resting on the peripheral lands of the base cap body, at a temperature of 150°C, under a pressure of 70 kilograms per $cmm^2$ and at a plunger injection rate of 10 meters per second.

6. The method of producing a plastic base cap as claimed in claim 5, wherein said liquid honing step comprises spraying an abrasive liquid containing water and powder of aluminum oxide of particle size from 50 to 60 microns and of the volume ratio of 2 parts water to one part aluminum oxide powder under a spraying pressure of 3 kilograms per $cmm^2$ at one second per $cmm^2$.

* * * * *